(12) United States Patent
Weisenberger et al.

(10) Patent No.: US 10,027,340 B1
(45) Date of Patent: Jul. 17, 2018

(54) METHOD AND APPARATUS TO DIGITIZE PULSE SHAPES FROM RADIATION DETECTORS

(71) Applicants: Andrew Weisenberger, Yorktown, VA (US); John E. McKisson, Williamsburg, VA (US); Hai Dong, Yorktown, VA (US); Chris Cuevas, Yorktown, VA (US); John McKisson, Hampton, VA (US); Wenze Xi, Odenton, MD (US)

(72) Inventors: Andrew Weisenberger, Yorktown, VA (US); John E. McKisson, Williamsburg, VA (US); Hai Dong, Yorktown, VA (US); Chris Cuevas, Yorktown, VA (US); John McKisson, Hampton, VA (US); Wenze Xi, Odenton, MD (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 779 days.

(21) Appl. No.: 13/731,720

(22) Filed: Dec. 31, 2012

(51) Int. Cl.
*H03M 1/00* (2006.01)
*H03M 1/12* (2006.01)
*G08C 19/16* (2006.01)
*G06F 3/05* (2006.01)

(52) U.S. Cl.
CPC ............... *H03M 1/12* (2013.01); *G06F 3/05* (2013.01); *G08C 19/16* (2013.01); *H03M 1/00* (2013.01); *H03M 1/001* (2013.01)

(58) Field of Classification Search
CPC ........ G08C 19/16; G08C 19/18; G08C 19/28; G08C 19/22; G08C 19/24; G08C 19/26; H03M 1/00; H03M 1/001; H03M 1/04; H03M 1/12; H03M 1/14; H03M 1/34;
(Continued)

(56) References Cited

U.S. PATENT DOCUMENTS

2002/0176535 A1\* 11/2002 Dixon et al. .................... 378/62
2012/0116730 A1\* 5/2012 Prasad et al. .................... 703/2
(Continued)

FOREIGN PATENT DOCUMENTS

WO    WO 2011125181 A1 \* 10/2011 .................... 250/362

OTHER PUBLICATIONS

Dong, Hai; Weisenberger; Andrew, McKisson; John; McKisson, Jack; Xi, Wenze; Cuevas, Chris; Wilson, Jeff; and Zukerman, Lohe; "A Versatile Scalable Pet Processing System", received Apr. 30, 2010, Conference Record of the 2010 IEEE Nuclear Science Symposium and Medical Imaging Conference, Knoxville, TN, U.S.A., Oct. 30-Nov. 6, 2010.

*Primary Examiner* — Hai Phan
*Assistant Examiner* — Franklin Balseca

(57) ABSTRACT

A field programmable gate array based multi-channel flash ADC unit combined with a high speed multi-lane data communications channel/Ethernet-like modular intercommunication providing a complete but easily expandable high-speed data acquisition system. This apparatus and method permits high-speed pulse-shape digitalization allowing position resolution imaging of particles having a range of energies and is scalable to achieve the efficient capture of coincident data from large electromagnetic detector arrays.

9 Claims, 2 Drawing Sheets

(58) Field of Classification Search
CPC .. G06F 3/05; G01T 1/172; G01T 7/00; G01C 3/08; H03K 19/21; Y10T 436/13
USPC ............ 340/870.01, 870.02, 870.07, 870.21
See application file for complete search history.

(56) References Cited

U.S. PATENT DOCUMENTS

2013/0020489 A1* 1/2013 Yoshida et al. ............... 250/362
2013/0058453 A1* 3/2013 Kuwabara .............. A61B 6/542
378/62

* cited by examiner

METHOD AND APPARATUS TO DIGITIZE PULSE SHAPES FROM RADIATION DETECTORS

The United States of America may have certain rights to this invention under Management and Operating Contract No. DE-AC05-84ER 40150 from the Department of Energy.

FIELD OF THE INVENTION

The present invention relates to electromagnetic radiation detectors, and, more specifically, an apparatus and method for converting analog signals to digital output and for processing such signals and output in radiation detectors and similar applications.

BACKGROUND OF THE INVENTION

Radiation detector systems, which involve radiation detectors for gamma rays, X-rays, and particle detection for neutrons, protons, and beta particles are often required to provide imaging capabilities in order to visualize the radiation interaction positions. These radiation detector systems comprise three principal subsystems: (i) radiation detectors materials, such as scintillators and solid state material (e.g., germanium, cadmium zinc telluride, etc. . . . ), (ii) a data acquisition system, and (iii) a computer or analogous device for data processing.

Data acquisition (DAQ) is the process of measuring an electrical or physical phenomenon such as voltage, current, temperature, pressure, or sound with a computer. A DAQ system consists of sensors, measurement hardware, and a computer with programmable software. As compared to traditional measurement systems, computer-based DAQ systems exploit the processing power, productivity, display, and connectivity capabilities of industry-standard computers providing a means for more powerful, flexible, and cost-effective measurements.

DAQ hardware acts as the interface between a computer and signals from the outside world. It primarily functions as a device to digitize incoming analog signals so that a computer can interpret them. The three key components of a DAQ hardware device used for measuring a signal are (i) the signal conditioning circuitry, (ii) analog-to-digital converter (ADC), and (iii) computer bus. Many DAQ hardware devices also include other functions for automating measurement systems and processes. For example, digital-to-analog converters (DAC) for the output of analog signals, digital I/O lines for the input and output digital signals, and counter/timers for counting and generating digital pulses. The DAQ systems form the core of detector systems used in nuclear and high-energy physics and in nuclear medicine imaging detector systems.

Special electronic systems, known as analog-to-digital (ADC) systems, are utilized to digitize analog electrical pulses that arise from radiation detectors that are solid state or scintillator based. Both in physics research and nuclear medicine, photomultiplier tubes (PMT) are a type of detector element that can generate high speed electrical pulses which need to be digitized in order to make a measurement. For instance, the Hamamatsu H8500 position sensitive photomultiplier tube (PSPMT) has 64 anode pads which, when the PSPMT is optically coupled to a scintillator, are used to convert gamma ray events into electrical charge. The 64 anode charge outputs can be combined by channel read out electronics into a 2x+2y coordinate map with four (4) voltage pulse outputs.

An ADC instrumentation system would be used to digitally capture the 4 outputs, process the data, and send the results to further electronics for processing. The ADC process could be a "total charge" digitization in which the total charge represented by the integration of the charge pulse is digitized or it could be the actual digitization of the charge pulse "shape." The charge integrated through the digitization process is referred to as "charge ADC." When the pulse shape is digitized this is often referred to as a "flash ADC."

Typically, one data acquisition channel can only handle the conversion of a single continuing stream of analog pulses. Multi-channel DAQ systems—typically more than 4 channels—are needed to convert analog pulse streams of a Gamma Camera for gamma ray interaction position computation for imaging purposes. In this case, a generic commercial DAQ system must be used. Large radiation detection systems with multiple Gamma Cameras may be handled by such a commercial system with channel numbers of 8, 16, 32, or 64. More medical applications can be found for large systems such as positron emission tomography (PET) or single-photon emission computed tomography (SPECT).

In large detection systems, the pulses which are members of a coincident event are likely to occur in distant locations, both spatially and electrically. In addition, with variations of cabling and components, the apparent time of the pulse arrival may be skewed relative to other pulses arising from the same nuclear emission. Determining the coincidence of pulses in such systems has been addressed historically by two methods: Direct timing coincidence detection which requires that all pulse arrival signals are routed to a single point where coincidence is determined, or by time tagging and post-processing, where data for all pulses are collected with additional synchronized time tag information and the valid coincidences are sorted out in a post processing step. The former method imposes a significant requirement on system cabling and electronics and the latter method imposes a large data transmission and storage requirement along with a significant post-processing step. These methods are suitable for many types of apparatus, but when systems are intended to be frequently reconfigured electrically and mechanically the first method become impractical, and when system bandwidth is limited and event rates are high the latter method loses its practicality.

The collection of data from several types of data acquisition systems and processing of that data to reconstruct useful data products, such as visual images or tomographic projections, relies on the detection and identification of time-coincident arrival of signals from pulses in multiple detectors that arise from specific types of nuclear emissions from sources. These valid coincidences must be differentiated from noise and accidental coincidences. Determining which of the many coincident and non-coincident pulses constitute valid coincident events, without requiring burdensome cabling or transmission and storage of voluminous data, has been a challenge for many coincident data acquisition systems. The system disclosed herein addresses the problem by performing the coincidence determination using time tagging in near real time with a minimum of data transmission required.

It is therefore desirable to have an efficient, versatile signal digitalization and processing system capable of being easily expanded and without the need for the transmission and storage of large amounts of data.

OBJECT OF THE INVENTION

It is an object of the invention to provide a scalable data acquisition apparatus and method for the digitalization and processing of analog signals from radiation detectors and other such sources.

SUMMARY OF THE INVENTION

The present invention discloses a modular data acquisition apparatus which incorporates a multi-channel flash analog-to-digital conversion system with an Ethernet type communication system. This apparatus permits high speed pulse-shape digitization allowing position resolution imaging of particles having a range of energies. The apparatus possesses gain and rate capabilities that are higher than in conventional systems and the system can be easily expanded. More specifically, the use of a field programmable gate array (FPGA) based multi-channel flash ADC combined with an Ethernet like modular intercommunication forms a complete but expandable high speed data acquisition system. The system includes software embedded within the FPGA which collects data from a number of channels, detects coincident events, i.e., pulse waveforms crossing a detection threshold or by more complex conditions, on multiple channels, and presents only the waveforms from the channels that contain valid coincident event data to an external processor for further processing, thereby reducing the amount of data that would otherwise have to be communicated to, and processed by, the external processor.

The accompanying method discloses a method for digitizing pulse shapes from radiation detectors relying upon the foregoing concepts.

DETAILED DESCRIPTION

The present invention discloses a device and method for digitizing pulse shapes from signals emanating from electromagnetic radiation detectors. This apparatus and method permits high speed pulse-shape digitalization allowing position resolution imaging of particles having a range of energies.

Figure 1:
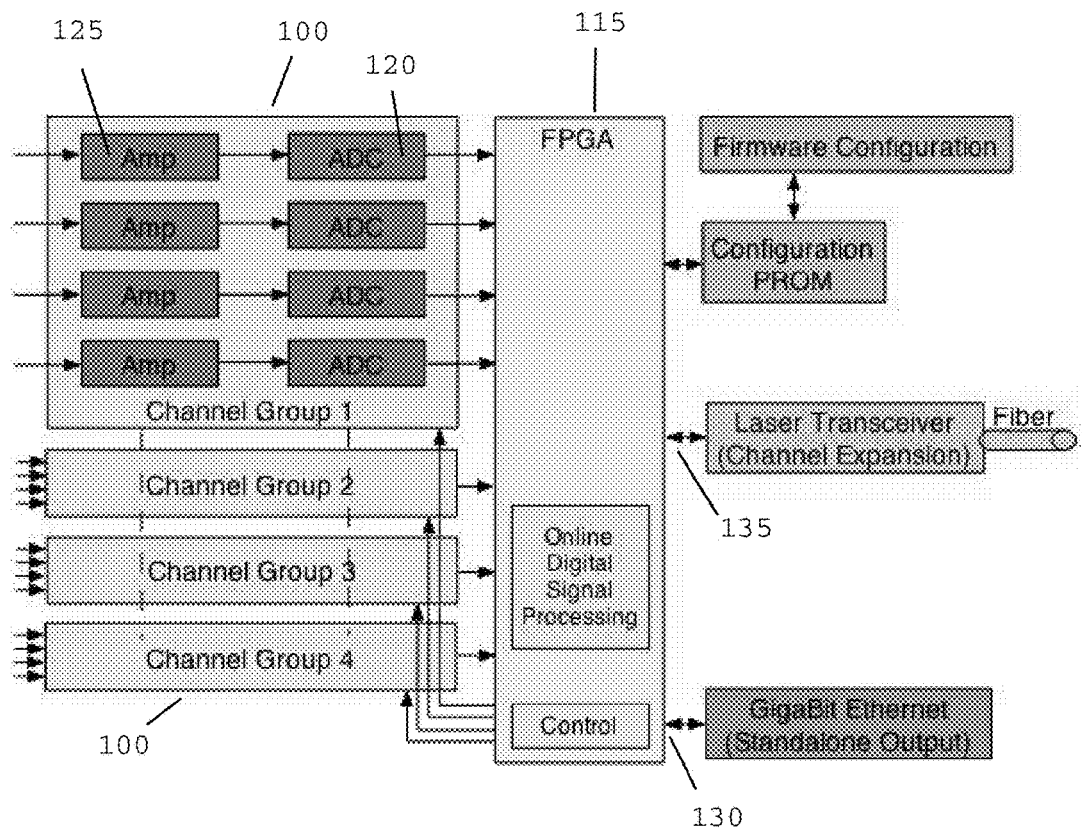
FIG. 1 is a diagram of an embodiment of the system.
Figure 2:
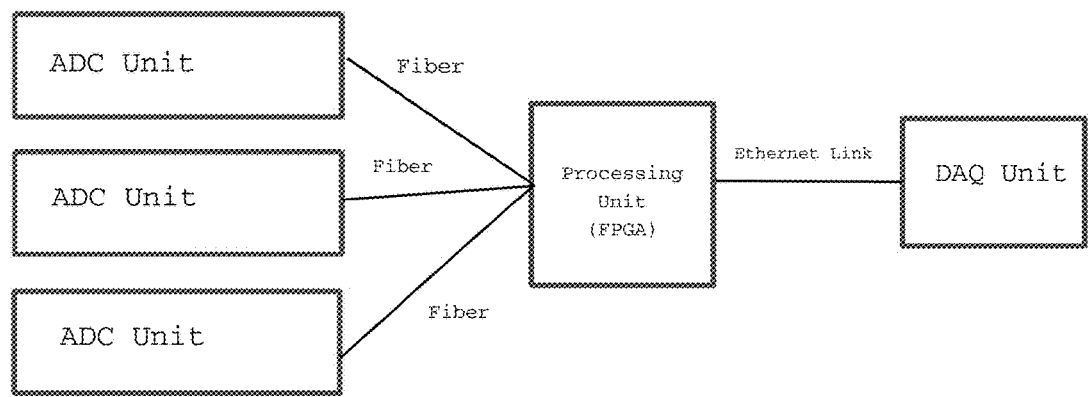
FIG. 2 is a diagram of an expanded embodiment of the system.

In the most basic embodiment, the invention can be divided into three portions: one or more ADC units 100, a FPGA unit 115, and a processing device. Referring now to FIG. 1, the interconnected elements in this embodiment are as follows: a field programmable gate array (FPGA), flash analog-to-digital converter (ADC) electronics capable of digitizing multiple channels, a data acquisition computer (CPU), software algorithms defining the electrical processing accomplished by the FPGA, and, software algorithms defining the serial communication between the FPGA and the data acquisition portion.

Each ADC unit 100 consists of one or more channels with each channel having ADC electronics 120 along with any necessary signal amplifiers 125 or other signal conditioning equipment. Flash ADC electronics capable of digitizing at least sixteen simultaneous channels are used in the preferred embodiment. The ADC unit is disposed to receive feedback when multiple channel units are in operation. Additional channels and additional ADC units may be added to the system in order to expand it as necessary. Each grouping of four channel units (which can accommodate four channels each) and the associated FPGA can be referred to as an independent ADC module.

When operating with a single ADC module, the FPGA 115 of that module manages and processes the data output from each ADC channel. The FPGA manages single event detection and time tagging as well as operating the ADC module communication resources. The FPGA unit includes an FPGA firmware programming port, Ethernet port 130 for standalone data output to DAQ computer, and a high speed multi-lane data communications channel, via laser electro-optics or high speed copper, for potential hierarchical multi-ADC/FPGA unit expansion relying upon fiber optic synchronization of multiple channels.

The embodiment of the system as set forth above, in standalone mode, would comprise a single ADC module and a DAQ processor. The FPGA in such module would be in communication, via the Ethernet connection, with the DAQ processor. One of the novel features of the instant invention, however, is that the system is inherently scalable such that any number of data inputs can be accommodated through the addition of multiple ADC modules and, possibly, one or more additional coordinating FPGAs.

In the case where two ADC modules are in operation, the FPGA of one of the two modules would act as a coincidence matrix processor (CMP), or, in other words, an interface between the ADC modules and the DAQ processor. Under these circumstances, one of the FPGA elements acts as the coincidence matrix processor and the other acts as a slave.

In the preferred embodiment, the system includes three or more ADC/FPGA modules. In such an embodiment, a separate processing unit may be defined. The processing unit would include the data acquisition CPU which would interface with at least one additional standalone FPGA element operating as the coincidence matrix processor (CMP). A laser transceiver interface 135 could be further included in the processing unit. A solid wire electrical interface or the or the laser transceiver operating through optical fibers allow intercommunication between a CMP unit and each respective ADC/FPGA unit, enabling data and trigger synchronizing. The preferred embodiment would incorporate the laser transceiver method of communication. Regardless, the final data is then output to the DAQ processor from the CMP. Due to the fact that the system and method is based upon an FPGA based multi-channel ADC unit combined with a laser transceiver/Ethernet like modular intercommunication, the system is easily scalable. That is, the electrical/laser transceiver interconnection facilities the addition of multiple ADC/FPGA so as to achieve the size necessary for the parameters of the particular detector or operation.

The Coincidence Matrix Processor (CMP) module inspects data, identifies time correlated data, and causes those data to be selected for transmission for processing. As mentioned supra, in cases in which only two Processing Units are needed, the software permits one Processing Unit to act as a CMP in wherein one Processing Unit is programmatically defined as a master and the other a slave.

As shown in FIG. 1, an FPGA can be reprogrammed for different applications depending on the number of ADC inputs. The firmware support two basic modes: Standalone Mode and Hierarchical Mode. The Hierarchical Mode addresses the critical problem of how to expand DAQ systems by combining multiple ADC/FPGA units with one or more hierarchical multiple layers of coincident metrics processing units through high-speed optical fibers using a laser transceiver. In the Hierarchical mode, the GigaBit Ethernet will be closed and all digitized data will be output through a fiber channel.

In the Standalone mode, the firmware gives the ADC/FPGA unit the flexibility to choose (1) single channel sub-mode, or (2) grouped channel mode. In both sub-modes, local coincident metrics and GigaBit Ethernet will be activated, while the high speed communication channel, e.g., the laser transceiver, will be closed. Furthermore, in the grouped channel mode, the grouped channel number can be flexibly configured into 2, 4(X+/−, Y+/−), 8, 16(Row column readout), where a single trigger can be generated for the combined channel group using the local coincident metrics.

The reprogrammable firmware endows the ADC/FPGA unit with the capability to adapt all the applications in either nuclear physics particle detection or biomedical imaging, in all scales, large and small, regardless of the system requirements for both channel numbers and system complexity. The following are examples showing the flexibility of the applications:

(1) Single photon-imaging gamma camera—Standalone mode with single channel sub-mode, typically less than 16 channels.
(2) Clinical SPECT scanner—Hierarchical mode with combined channel (4 channel combined), typically less than 100 channels.
(3) Clinical PET scanner—Hierarchical mode with combined channel (4 channel combined) with two-layer CMP unit and coincident matrices in multiple CMP unit, typically less than 200 channels.
(4) Nuclear physics colorimeters—Hierarchical mode with hybrid combined channel (single channel, multiple channels combined) with multi-layer CMP unit and coincident matrices in multiple CMP unit, typically several thousand channels.

The system and method allow for management of both a time tag and coincidence matrix approach when capturing coincident data from large detector arrays. The FPGA device inside the ADC/FPGA unit provides many resources for online digital signal processing (DSP) and monitoring for the digitized pulse signals, including online pulse shape filtering to reduce the noise components residing on the pulses, retrieving the DC current pedestal value by using rectangular delayed window, calculating the pulse rise time and decay time, calculating the individual pulse charge. The DSP feature allows online monitoring of the DSP results and transmission of such results to the registers for FADC configuration. This is an improvement over existing devices which do not allow such configuration due to limitations found in the VME bus in such devices. The high-speed GigaBit Ethernet and Laser transceiver fiber optical channel enables digitally processing of the pulses, monitoring the result, and dynamically feedback these result into registers for DAQ reconfiguration, e.g., DC pedestal reset.

The fiber optical channel in the ADC/FPGA unit and CMP unit would provide a hierarchical modular data acquisition system which combines a multi-channel flash ADC with a high-speed laser transceiver (2.5 Gbits/s, 5 Gbits/s, 10 Gbits/s, or higher) and an Ethernet-type based communication system. The TCP/IP or UDP protocol used for these high-speed interfaces is universally adapted to all major computer operating systems, including Mac, Windows, Unix and Linux. This will simplify the system design and overcome traditional limitations preventing multi-platform development.

The system includes software embedded into the FPGA which collects data from a number of channels, detects coincident events, i.e., pulse waveforms crossing a detection threshold or by more complex conditions, on multiple channels, and presents only the waveforms from the channels that contain valid coincident event data to an external processor for further processing. The software acts to continuously capture waveform sample data on multiple channels, temporarily store those samples locally in a processing unit, which could be the FPGA of each ADC module, and transmit minimal but sufficient timing and channel information from detected events to the CMP to allow the CMP to detect valid coincidences. Upon detecting a valid coincidence from the data presented, the CMP then responds to each processing unit that presented channel information that was in coincidence, indicating with a trigger signal to each of those processing units to transmit a portion of each waveform containing the signal(s) of interest to the CMP, so that the complete set of channel waveforms can be tagged as coincident, collated and transmitted as a single record via one or multiple communication packets to the external processor.

The system is presumed to be hierarchically cascadable through the CMP modules in situations where more processing units are in use beyond the number that can be accommodated by a single CMP. In this configuration the lower level CMP only operates as a hub for combining the signal streams from processing units or from lower level CMP modules to the next uppermost CMP in the hierarchy. The uppermost CMP in the hierarchy makes the coincidence determinations and transmits that information down through the CMP hierarchy to the processing units. The processing unit response is then transmitted up through the hierarchy and eventually to the external processor. In a multiple-CMP configuration a lower-level CMP may be able to make a complete coincidence determination for events that occur within the processing units connected directly to that CMP.

The processing unit of each ADC module stores all digitized samples of all channels in a limited length buffer of sufficient length to assure that under worst case conditions of lag and communication delay, the CMP signals of coincidence will reach the processing unit before the waveform data expires.

In this context, an event is defined as a signal of interest on a single channel or on a group of channels (a user-configurable choice). When an event occurs, the identity of the channel or group along with sufficient other information is forwarded to the coincidence detection system. Events on a single channel are detected when the signal level on a channel rises above the detection threshold. The event time is the clock period in which the signal rises above threshold. Events for a group may be defined in a number of ways:

i. Any one channel signal of a group rises above threshold
ii. A multiplicity of channels in the group have signals that are simultaneously above threshold (The event time is the clock period in which the condition is first satisfied)
iii. The sum of the signals in the group rises above a threshold.

Once the processing unit has received a trigger signal from the CMP identifying the waveform data that has been determined to be members of a valid coincident event, those data are transmitted to the CMP. The size of the data depends on the grouping of channels, with any number of channels 1-16 constituting a group. There are two modes of operation. In the first mode, all waveforms for a group are transmitted, and in the second mode, chosen when bandwidth limitations are important, integrated values for each waveform are transmitted rather than the entire waveform.

Event data from that arrives at the CMP from each of two or more processing units are collated and placed together into a full event record and then transmitted to the external processor. The complete record of a valid event includes the waveforms (or integrated sums) from all event members that constitute the coincidence.

The instant apparatus and method provides a novel, hierarchical, expandable, reprogrammable, versatile, online DSP, universal computer interfaced DAQ system not only limited to nuclear physics and nuclear medicine needs, but also adapt to generically wide range applications, ranging from simple requirement to very complicated large applications. The apparatus and method further satisfies all the requirements for large detection systems, like nuclear physics particle detection systems, as it is (i) expandable and scalable, (ii) versatile to adapt to a myriad of applications, (iii) possesses full digital signal processing capability, and (iv) incorporates high-speed data interlinks with fiber optics and Giga-bit Ethernet (v) permitting adaptation to all major computer platforms.

While the invention has been described in reference to certain preferred embodiments, it will be readily apparent to one of ordinary skill in the art that certain modifications or variations may be made to the system without departing from the scope of invention claimed below and described in the foregoing specification.

What is claimed is:

1. An expandable component system for digitizing pulse shapes comprising:
   a plurality of collection and processing units each including a field programmable gate array;
   a coincidence matrix processor comprising a field programmable gate array; said coincidence matrix processor in communication with said plurality of collection and processing units via a high speed multi-lane data communications channel;
   a data acquisition module;
   a Gigabit Ethernet communication conduit between said coincidence matrix processor and said data acquisition module;
   an algorithm to facilitate operation of the expandable component system residing on said coincidence matrix processor; and
   an algorithm defining a serial communication between said coincidence matrix processor and said data acquisition module,
   whereby said coincidence matrix processor is capable of identifying valid coincidences within data collected from said plurality of collection and processing units via the digitization of pulse charge shapes.

2. The expandable component system of claim 1 wherein said plurality of collection and processing units includes flash analog to digital conversion hardware capable of digitizing at least sixteen simultaneous channels.

3. The expandable component system of claim 1 wherein said high speed multi-lane data communications channel comprises a laser electro-optics communication arrangement.

4. A method of digitizing electrical pulses emanating from electromagnetic radiation detectors and position resolution imaging comprising:
   providing a collection module having a plurality of conversion units; said conversion units comprising a field programmable gate array including a Gigabits Ethernet port and further comprising flash analog to digital electronics capable of digitizing at least sixteen channels simultaneously;
   providing a processor module; said processor module being comprised of at least one field programmable gate array having an algorithm embedded therein capable of detecting and identifying a time-coincident arrival of signals from pulses originating from multiple channels in said collection module;
   using said collection module to capture coincident analog data from an electromagnetic radiation detector;
   digitizing a pulse shape of such analog data from at least two of said at least sixteen simultaneous channels and thereby generating output;
   using said output to generate waveform sample data from said at least two of said at least sixteen simultaneous channels;
   transmitting timing and channel information of said sample data from said collection module to said processing module;
   processing said waveform sample data within said processing module in order to detect valid coincidences within said sample data;
   communicating with said collection module upon the detection of a valid coincidence in order to use a portion of said waveform to identify and tag a complete set of channel waveforms from which said portion is derived; and
   processing and transmitting the tagged channel waveforms to an external processor.

5. The method of digitizing electrical pulses of claim 4 wherein said field programmable gate arrays of said plurality of conversion units further include a laser transceiver port.

6. A method of digitizing electrical pulses emanating from electromagnetic radiation detectors and position resolution imaging comprising:
   providing at least three collection modules; each said collection module comprising a field programmable gate array including a Gigabits Ethernet port and further comprising flash analog to digital electronics capable of digitizing at least sixteen channels simultaneously;
   providing at least one coincidence processor module; said processor module being comprised of at least one field programmable gate array having an algorithm embedded therein capable of detecting and identifying a time-coincident arrival of signals from pulses originating from multiple channels in said collection modules;
   using said collection modules to capture coincident analog data from an electromagnetic radiation detector;
   digitizing a pulse shape of such analog data and thereby generating output which permits identification of a pulse waveform of this data;
   transmitting waveform sample data and timing and channel information of said data from said collection modules to said processing module;
   processing said waveform sample data within said processing module in order to detect valid coincidences within said sample data;
   performing real-time tagging by a step of said processing module communicating with said collection module upon the detection of a valid coincidence in order to use the portion of said waveform to identify and tag a complete set of channel waveforms from which said portion is derived; and,
   processing and transmitting only the tagged channel waveforms to an external processor.

7. The method of claim 6 wherein said processing module comprises at least one upper-level field programmable gate array and at least one lower-level field programmable gate array wherein said at least one upper level array and at least one lower-level array are in hierarchical communication; said lower level array collecting signal data and transmitting such data to the next upper-level field programmable gate array; said upper level array making a coincidence determination and transmitting information based upon these results down through the coincident processing module hierarchy to one or more collection modules.

8. The method of claim 6 wherein said transmitting only the tagged channel waveforms to an external processor comprises transmitting all waveforms for a tagged group.

9. The method of claim 6 wherein said transmitting only the tagged channel waveforms to an external processor comprises transmitting only integrated values for each waveform for a tagged group.

\* \* \* \* \*